(12) United States Patent
Chen et al.

(10) Patent No.: US 9,099,168 B2
(45) Date of Patent: Aug. 4, 2015

(54) METHOD FOR EXTENDING WORD-LINE PULSES

(75) Inventors: Hsu-Shun Chen, Toufen Township (TW); Cheng-Hung Lee, Hsin-Chu (TW); Hong-Chen Cheng, Hsin-Chu (TW); Chung-Yi Wu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 286 days.

(21) Appl. No.: 13/616,377

(22) Filed: Sep. 14, 2012

(65) Prior Publication Data

US 2013/0003446 A1 Jan. 3, 2013

Related U.S. Application Data

(62) Division of application No. 12/842,189, filed on Jul. 23, 2010, now Pat. No. 8,279,684.

(60) Provisional application No. 61/251,564, filed on Oct. 14, 2009.

(51) Int. Cl.
*G11C 8/08* (2006.01)
*G11C 11/413* (2006.01)

(52) U.S. Cl.
CPC ............... *G11C 8/08* (2013.01); *G11C 11/413* (2013.01)

(58) Field of Classification Search
CPC ................................. G11C 8/08; G11C 11/413

USPC ................. 365/189.09, 226, 189.011, 189.08
See application file for complete search history.

(56) References Cited

U.S. PATENT DOCUMENTS

| 5,808,960 | A | | 9/1998 | McClure | |
|---|---|---|---|---|---|
| 5,835,420 | A | | 11/1998 | Lee et al. | |
| 6,097,359 | A | * | 8/2000 | Kwon et al. | 345/74.1 |
| 6,111,813 | A | | 8/2000 | Huang | |
| 6,252,820 | B1 | | 6/2001 | Nakamura | |
| 6,567,318 | B2 | * | 5/2003 | Bedarida et al. | 365/189.05 |
| 7,012,597 | B2 | * | 3/2006 | Kasai | 345/204 |
| 7,450,439 | B2 | * | 11/2008 | Lee et al. | 365/189.09 |
| 7,499,324 | B2 | * | 3/2009 | Cernea et al. | 365/185.12 |
| 8,054,698 | B2 | | 11/2011 | De Sandre et al. | |

* cited by examiner

*Primary Examiner* — Vanthu Nguyen
(74) *Attorney, Agent, or Firm* — Slater & Matsil, L.L.P.

(57) ABSTRACT

An integrated circuit includes a positive power supply node, a current tracking circuit, and a current mirroring circuit including a plurality of current paths coupled in parallel. The currents of the plurality of current paths mirror a current of the current tracking circuit. The current mirroring circuit is configured to turn off the plurality of current paths one-by-one in response to a reduction in a positive power supply voltage on the positive power supply node. The integrated circuit further includes a charging node receiving a summation current of the plurality of current paths, wherein a voltage on the charging node is configured to increase through a charging of the summation current.

20 Claims, 2 Drawing Sheets

WORD-LINE PULSE CONTROL CIRCUIT

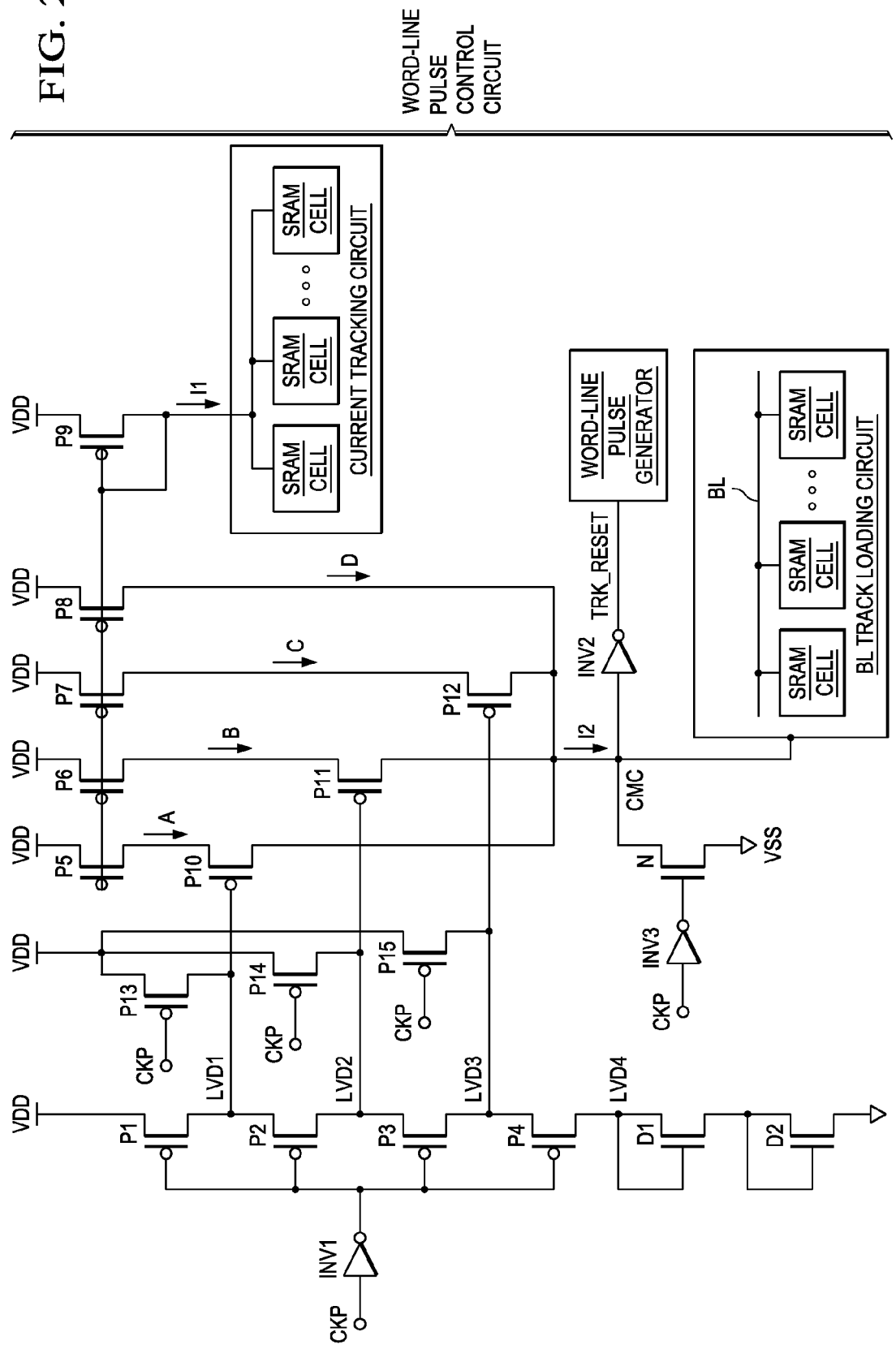

METHOD FOR EXTENDING WORD-LINE PULSES

This application is a divisional of U.S. patent application Ser. No. 12/842,189, filed Jul. 23, 2010, entitled, "Method for Extending Word-Line Pulses," which claims the benefit of U.S. Provisional Application No. 61/251,564 filed on Oct. 14, 2009, entitled "Method for Extending Word-Line Pulses," which applications are hereby incorporated herein by reference.

TECHNICAL FIELD

This application relates generally to integrated circuits and more particularly to the circuits for controlling the widths of word-line pulses of static random access memory (SRAM) arrays.

BACKGROUND

Static random access memory (SRAM) is commonly used in integrated circuits. SRAM cells have the advantageous feature of holding data without a need for refreshing. SRAM cells may include different numbers of transistors and are often accordingly referred to by the number of transistors, for example, six-transistor (6T) SRAM, eight-transistor (8T) SRAM, and the like. The transistors typically form a data latch for storing a bit. Additional transistors may be added to control the access to the transistors. SRAM cells are typically arranged as an array having rows and columns. Typically, each row of the SRAM cells is connected to a word-line, which determines whether the current SRAM cell is selected or not. Each column of the SRAM cells is connected to a bit-line (or a pair of bit-lines), which is used for storing a bit into the SRAM cell or read from the SRAM cell.

With the scaling of integrated circuits, the power supply voltages of integrated circuits are reduced, along with the power supply voltages of memory circuits. Accordingly, read and write margins of the SRAM cells, which determine how reliably the bits of the SRAM cells can be read from and written into, respectively, are reduced. The situation is further worsened by the unexpected reduction in the power supply voltages caused by variations. Due to the existence of static noise, the reduced read and write margins may cause errors in the respective read and write operations.

To improve the write margins, the widths of word-line pulses are desirably extended in response to the drop in the power supply voltages, so that the access time to SRAM cells is also extended. In conventional circuits, however, although methods were provided to extend the widths of word-line pulses, the increase in the widths of word-line pulses was linear to the reduction in the power supply voltages. Accordingly, the increase in the widths of word-line pulses may not be able to satisfy the requirement to suit for the reduction in the power supply voltages. This results in the pre-mature starting of sense amplifiers and in turn causes the failure of write operations.

SUMMARY

In accordance with one aspect of the embodiment, an integrated circuit includes a positive power supply node, a current tracking circuit, and a current mirroring circuit including a plurality of current paths coupled in parallel. The currents of the plurality of current paths mirror a current of the current tracking circuit. The current mirroring circuit is configured to turn off the plurality of current paths one-by-one in response to a reduction in a positive power supply voltage on the positive power supply node. The integrated circuit further includes a charging node receiving a summation current of the plurality of current paths, wherein a voltage on the charging node is configured to increase through a charging of the summation current.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which:

FIG. 2 illustrates an exemplary circuit diagram of the word-line pulse control circuit shown in FIG. 1.

DETAILED DESCRIPTION OF ILLUSTRATIVE EMBODIMENTS

The making and using of the embodiments of present application are discussed in detail below. It should be appreciated, however, that the embodiments provide many applicable inventive concepts that can be embodied in a wide variety of specific contexts. The specific embodiments discussed are merely illustrative of specific ways to make and use the embodiments and do not limit the scope of the disclosure.

A novel word-line pulse control circuit is provided in accordance with an embodiment, wherein the word-line pulse control circuit controls the width of word-line pulses that are used to operate a static random access memory (SRAM) array. The variations and the operation of the embodiment are discussed. Throughout the various views and illustrative embodiments, like reference numbers are used to designate like elements.

Figure 1:
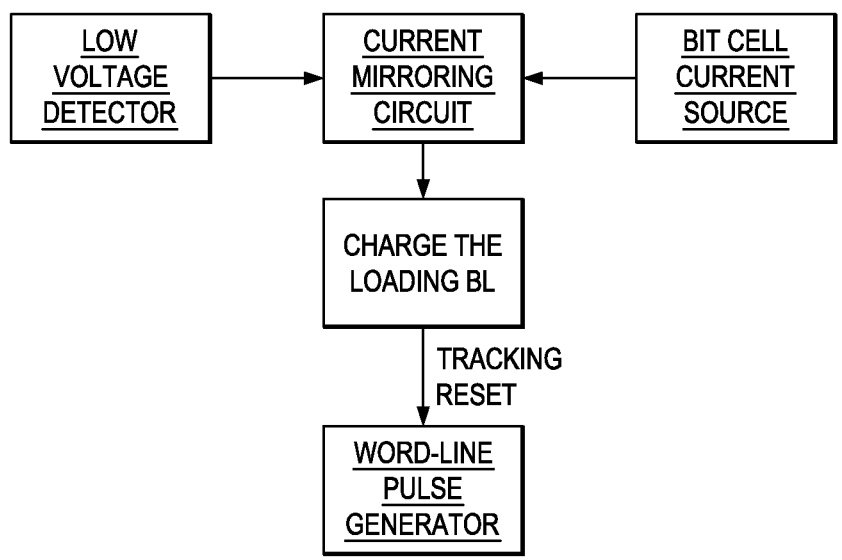
FIG. 1 illustrates a block diagram of a word-line pulse control circuit in accordance with an embodiment.

FIG. 1 illustrates a block diagram of the word-line pulse control circuit in accordance with an embodiment. A low voltage detector is configured to detect a voltage level of the positive power supply voltage VDD (not shown in FIG. 1, please refer to FIG. 2). When the positive power supply voltage VDD varies, the control signals outputted by the low voltage detector also varies.

The current mirroring circuit may include a plurality of current paths, each mirroring the bit cell current provided by the bit cell current source. The current mirroring circuit is controlled by the control signals received from the low voltage detector. When the positive power supply voltage VDD is low, the current mirroring circuit cuts off some of the current paths and hence outputs a smaller current. Conversely, when the positive power supply voltage VDD is high, the current mirroring circuit cuts off fewer, or none, of the current paths and hence outputs a greater current. The current outputted by the current mirroring circuit is used to charge a loading bit-line (BL, a bit-line mimics the behavior of a real bit-line of the SRAM array), which is connected to a column of SRAM cells. The time the loading bit-line starts to be charged may also be the time a word-line pulse is started (by a word-line pulse generator). When the voltage resulted from the charging of the loading bit-line reaches a pre-determined voltage level, a tracking reset signal is sent out by the word-line pulse generator, and the word-line pulse is ended. The width of the word-line pulse is thus equal to the duration between the time the loading bit-line starts to be charged and the time the tracking reset signal is sent out.

It is observed that through the circuit shown in FIG. 1, the time the tracking reset signal is sent is affected by the magnitude of the positive power supply voltage VDD. When the positive power supply voltage VDD is high, the current mirroring circuit outputs a relatively great current to charge the loading bit-line, and hence the pre-determined voltage level can be reached in a relatively short time. As a result, the width of the word-line pulse is short. Conversely, when the positive power supply voltage VDD is high, the current mirroring circuit outputs a relatively small current to charge the loading bit-line, and hence it takes longer for the pre-determined voltage level to be reached. As a result, the width of the word-line pulse is long.

FIG. 2 illustrates an exemplary circuit diagram of a circuit implementing the word-line pulse control circuit shown in FIG. 1. The low voltage detector includes PMOS transistors P1, P2, P3, and P4, and diodes D1 and D2. It is appreciated that the number of PMOS transistors and the number of diodes may be greater or smaller than what is shown in FIG. 2, as will be discussed in more detail in subsequent paragraphs. Diodes D1 and D2 may be formed using, for example, NMOS transistors with the gate and the drain of each of the NMOS transistors interconnected. The source-to-drain paths of PMOS transistors P1, P2, P3, and P4 are connected in series. The gates of PMOS transistors P1, P2, P3, and P4 are interconnected and are coupled to clock node CKP through inverter INV1. Clock node CKP is connected to a clock source and hence carries a clock pulse signal. The source of PMOS transistor P1 is connected to positive power supply voltage VDD.

When the clock signal at clock node CKP is at logic low, for example, equal to voltage VSS, the word-line pulse control circuit stands by and no current flows through current paths A, B, and C. Assuming a logic high signal is applied to node CKP at time T1, the word-line pulse generator (which is coupled to word-lines of an SRAM cell array (not shown)) starts the word-line pulse, for example, turning on the word lines of the SRAM cells to be written into. In the meantime, inverter INV1 inverts the high clock pulse and the gates of PMOS transistors P1, P2, P3, and P4 receive a logic low signal, so that PMOS transistors P1, P2, P3, and P4 are turned on. Assuming that the voltage drops on each of diodes D1 and D2 are V_d (which may be, for example, 0.3V), then voltage V_LVD4 on node LVD4 is 2V_d. The voltage drop on PMOS transistors P1, P2, P3, and P4 is VDD-2V_d. Further assuming PMOS transistors P1, P2, P3, and P4 are identical to each other, the voltage drop on each of PMOS transistors P1, P2, P3, and P4 is (VDD-2V_d)/4. Accordingly, voltage V_LVD3 at node LVD3 is 2V_d+(VDD-2V_d)/4, voltage V_LVD2 at node LVD2 is 2V_d+(VDD-2V_d)/2, and voltage V_LVD1 at node LVD1 is 2V_d+3(VDD-2V_d)/4. Voltages V_LVD1, V_LVD2, and V_LVD3 are the control signals outputted by the low voltage detector. It is noted that voltage V_LVD4 on node LVD4 is free from the variation of positive power supply voltage VDD. Accordingly, when positive power supply voltage VDD becomes lower, voltages V_LVD1, V_LVD2, and V_LVD3 all become lower, with voltage V_LVD 1 being higher than voltage V_LVD2, and voltage V_LVD2 being higher than voltage V_LVD3.

The current tracking circuit is configured to output current I1 that tracks the bit cell current. In an embodiment, the current tracking circuit includes a plurality of SRAM cells connected in parallel. Current I1 is thus the sum of the currents of the plurality of SRAM cells. Accordingly, the variation in the bit cell current of single SRAM cells is averaged out. The number of the plurality of SRAM cells in the current tracking circuit may be 8, 12, 16, or any other number, depending on the design preference.

The current mirroring circuit includes PMOS transistors P5 through P8 and P10 through P12. The gate and the drain of PMOS transistor P9 are interconnected. The gates of PMOS transistors P5 through P9 are interconnected, and form current mirrors with each other. PMOS transistors P5 through P8 may be identical to each other with the same gate width-to-length (W/L) ratio, although they may also be different from each other. The W/L ratio of PMOS transistor P9 may be greater than the W/L ratios of PMOS transistors P5 through P8.

The gates of PMOS transistors P10, P11, and P12 are connected to nodes LVD1, LVD2, and LVD3, respectively, and hence the operation of current paths A, B, and C are controlled by the control signals of the low voltage detector. The currents flowing through current paths A, B, C, and D are summed as I2, which charges a bit-line (BL) track loading circuit. In an embodiment, the BL track loading circuit comprises a column of SRAM cells with a bit-line (or a pair of complementary bit-lines) connecting the column of SRAM cells. As a result, the charging of the BL track loading circuit mimics the charging of the bit-lines in the SRAM cell array, to which the word-line pulse generator is connected. The BL track loading circuit behaves similar to a capacitor, and with the charging of current I2, voltage V_CMC at node CMC increases. When voltage V_CMC reaches a certain level, inverter INV2 flips to output a track reset signal, for example, a low voltage, at node TRK_RESET, which track reset signal is used to control the word-line pulse generator, which then ends the word-line pulse at time T2. The time difference T2-T1 is the width of the word-line pulse.

PMOS transistors P10, P11, and P12 control current paths A, B, and C, respectively. If positive power supply voltage VDD is high, since voltage V_LVD4 at node LVD4 is relatively constant, voltage V_LVD1, V_LVD2, and V_LVD3 are all relatively high, and PMOS transistors P10 through P12 are all turned on (due to their relatively high source-to-gate voltages). However, when positive power supply voltage VDD varies to a lower level, since the source-to-gate voltage of PMOS transistor P10 is the smallest among PMOS transistors P10 through P12, PMOS transistor P10 is turned off first, while PMOS transistors P11 and P12 are still on. Accordingly, current I2 equals to the sum of the currents in current paths B, C, and D. With the further reduction of positive power supply voltage VDD, PMOS transistor P11 is turned off in addition to PMOS transistor P10, and current I2 equals the currents in current paths C and D. If positive power supply voltage VDD is further reduced, all three PMOS transistors P10 through P12 may be turned off, and only current path D provides a charging current to the BL track loading circuit. Therefore, with the increasing reduction in positive power supply voltage VDD, current paths A, B, and C are turned off one-by-one, and the current mirroring circuit provides increasingly smaller charging current I2 to charge the BL track loading circuit. The time to charge voltage V_CMD to the level for flipping inverter INV2 thus becomes increasingly longer with the increasing reduction in positive power supply voltage VDD.

Optionally, PMOS transistors P13 through P15 are added to reduce the current consumption of the word-line pulse control circuit. When the word-line pulse control circuit stands by, PMOS transistors P13 through P15 are turned on, so that current paths A, B and C are turned off. Inverter INV3 and NMOS transistor N are used to connect node CMC to the electrical ground (hence discharge node CMC) when no charging to node CMC is performed, and disconnect node CMC from the electrical ground when node CMC is charged.

Figure 3:
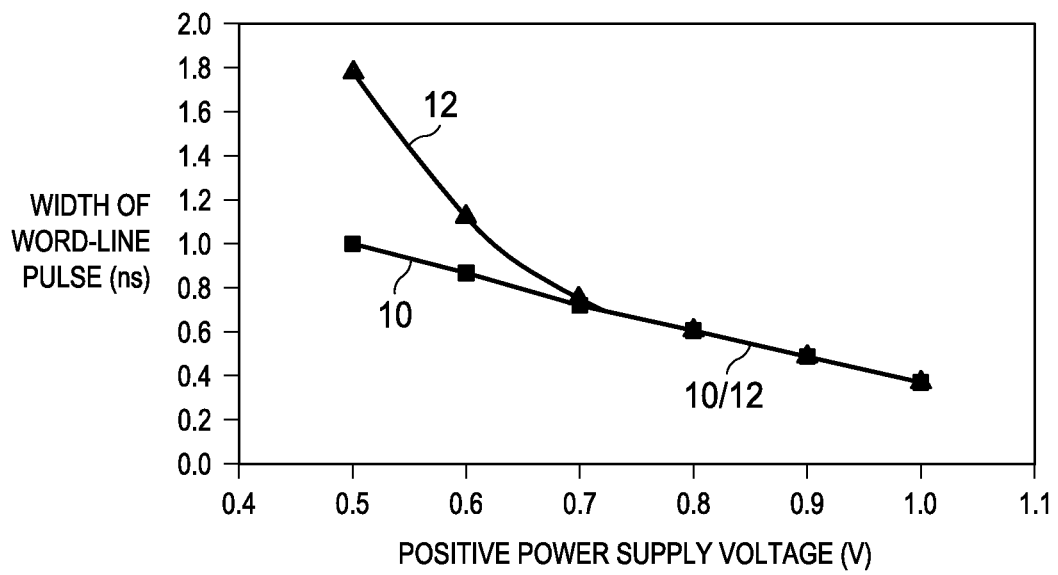
FIG. 3 shows the widths of word-line pulses as functions of power supply voltages.

FIG. 3 illustrates simulation results, wherein the word-line pulse widths are illustrated as functions of positive power supply voltage VDD. Line 10 indicates the behavior of conventional word-line pulses, wherein the increase in the widths of word-line pulses is linear to the reduction in positive power supply voltage VDD. Line 12 indicates the behavior of the circuits shown in FIGS. 1 and 2. It is noted that the increase in the widths of word-line pulses is no longer linear, and may become much more significant when positive power supply voltage VDD decreases.

It is appreciated that the number of the PMOS transistors in the low voltage detector (refer to FIG. 2) determines the smoothness of line 12 and the more PMOS transistors in the low voltage detector, the smoother line 12 is. The magnitude of the word-line pulse is determined by the currents provided by each of current paths A, B, C, and D, and/or the W/L ratio of transistor P9 to the W/L ratios of PMOS transistors P5-P8. Further, the number of diodes in the low voltage detector determines the point at which lines 10 and 12 are separated from each other. In other words, the greater the number of diodes, the word-line pulse will increase at a greater positive power supply voltage. Accordingly, the widths of word-line pulses may be adjusted as desirable to optimize the write operation of SRAM cells and can be fine-tuned.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit comprising:
a positive power supply node;
a first plurality of PMOS transistors coupled in series and coupled to the positive power supply node, wherein gates of the plurality of PMOS transistors are coupled to a clock signal;
a plurality of diodes coupled between the first plurality of PMOS transistors and an electrical ground;
a charging node;
a second plurality of PMOS transistors configured to form current mirrors with each other, wherein each of the second plurality of PMOS transistors is coupled between the positive power supply node and the charging node;
a third plurality of PMOS transistors, each coupled between one of the second plurality of PMOS transistors and the charging node, wherein a gate of each of the third plurality of PMOS transistors is coupled to a drain of one of the first plurality of PMOS transistors; and
a PMOS transistor forming current mirrors with the second plurality of PMOS transistors, wherein a drain of the PMOS transistor is coupled to the charging node.

2. The integrated circuit of claim 1 further comprising:
an additional PMOS transistor comprising a gate and a drain coupled to the gate, wherein the additional PMOS transistor forms current mirrors with the second plurality of PMOS transistors;
a bit-line track loading circuit coupled to the charging node, wherein the bit-line track loading circuit comprises a column of SRAM cells, and a bit-line coupled to the column of SRAM cells, and wherein the charging node is coupled to the bit-line;
a word-line pulse generator; and
an inverter comprising an input coupled to the charging node, and an output coupled to the word-line pulse generator.

3. The integrated circuit of claim 1 further comprising:
a clock node; and
a fourth plurality of PMOS transistors, each comprising:
a source coupled to the positive power supply node;
a drain coupled to a gate of one of the third plurality of PMOS transistors; and
a gate coupled to the clock node.

4. The integrated circuit of claim 3, wherein the clock node is further coupled to the gates of the first plurality of PMOS transistors.

5. The integrated circuit of claim 1 further comprising:
a clock node;
an inverter comprising an input coupled to the clock node; and
an NMOS transistor comprising a drain coupled to the charging node, a gate coupled to an output of the inverter, and a source coupled to an electrical ground.

6. The integrated circuit of claim 1, wherein each of the diodes is formed of an NMOS transistor, with a gate and a drain of the NMOS transistor being interconnected.

7. The integrated circuit of claim 1 further comprising an SRAM array.

8. An integrated circuit comprising:
a positive power supply node;
a ground node;
means for generating control signals coupled between the positive power supply node and the ground node, wherein the means for generating control signals is coupled to a clock node, wherein an output signal of the means for generating control signals is a derivative of a clock signal from the clock node;
means for generating a reference voltage relative to ground, the means for generating a reference voltage being coupled between the means for generating control signals and the ground node;
means for mirroring current configured to generate current;
means for controlling current coupled to the means for generating control signals and coupled to the means for mirroring current, and configured to sum all or some of the generated current in response to the means for generating control signals; and
a charging node coupled to the means for mirroring current by way of the means for controlling current.

9. The integrated circuit of claim 8 wherein:
said means for generating control signals comprises a first plurality of PMOS transistors coupled in series and coupled to the positive power supply node, each of the first plurality of PMOS having a respective gate coupled to a common node;

said means for generating a reference voltage relative to ground comprises a plurality of diodes coupled between the first plurality of PMOS transistors and a ground;

said means for mirroring current comprises a second plurality of PMOS transistors, wherein each of the second plurality of PMOS transistors is coupled between the positive power supply node and the charging node; and said means for controlling current a third plurality of PMOS transistors, each coupled between one of the second plurality of PMOS transistors and the charging node, wherein a gate of each of the third plurality of PMOS transistors is coupled to a drain of one of the first plurality of PMOS transistors.

10. The integrated circuit of claim 9 further comprising;
a PMOS transistor forming current mirrors with the second plurality of PMOS transistors, wherein a drain of the PMOS transistor is coupled to the charging node.

11. The integrated circuit of claim 9 further comprising:
means for charging a SRAM column coupled to the charging node.

12. The integrated circuit of claim 11 wherein the means for charging an SRAM column includes a column of SRAM cells coupled to a bit line.

13. An integrated circuit comprising:
a positive power supply node;
a chain of series-coupled PMOS transistors wherein a drain of a first PMOS transistor and a source of a second PMOS transistor define a first common node, a drain of the second PMOS transistor and a source of a third PMOS transistor defined a second common node;
a clock node, wherein each PMOS transistor in the chain of series-coupled PMOS transistors has a respective gate coupled to the clock node;
a first end of the chain being tied to the positive power supply node and a second end of the chain being tied to a node that is invariant to variations in the positive power supply;
a first PMOS control transistor having a gate coupled to the first common node, a source coupled to a first current mirror element, and a drain coupled to a charging node, and configured to pass or not pass current from the first current mirror element to the charging node in response to a voltage on the first common node;
a second PMOS control transistor having a gate coupled to the second common node, a source coupled to a second current mirror element and configured to pass or not pass current from the second current mirror element to the charging node in response to a voltage on the second common node; and
a third current mirror element coupled to the charging node.

14. The integrated circuit of claim 13 wherein the chain of series-coupled PMOS transistors includes four PMOS transistors and three common nodes.

15. The integrated circuit of claim 13 further comprising a capacitive element coupled between a ground node and the node that is invariant to variations in the positive power supply.

16. The integrated circuit of claim 15 wherein the capacitive element includes:
a first diode-connected NMOS transistor having a gate and drain coupled to the node that is invariant to variations in the positive power supply; and
a second diode-connected NMOS transistor having a gate and drain coupled to a source of the first diode-connected NMOS transistor and source coupled to ground.

17. The integrated circuit of claim 13 further comprising a loading circuit coupled to the charging node.

18. The integrated circuit of claim 17 wherein the loading circuit includes a column of SRAM cells and a bit line interconnecting the SRAM cells.

19. The integrated circuit of claim 13 further comprising a tracking circuit including a plurality of parallel-coupled SRAM cells and a bit line interconnecting the SRAM cells, and a fourth current mirror element coupled to the bit line.

20. The integrated circuit of claim 15 wherein the capacitive element is coupled to the chain of series-coupled PMOS transistors.

* * * * *